United States Patent
George et al.

(10) Patent No.: US 10,038,453 B1
(45) Date of Patent: Jul. 31, 2018

(54) CAPACITOR CALIBRATION

(71) Applicant: TEXAS INSTRUMENTS INCORPORATED, Dallas, TX (US)

(72) Inventors: Anand Jerry George, Calicut (IN); Rishi Soundararajan, Bengaluru (IN); Visvesvaraya Pentakota, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/792,924

(22) Filed: Oct. 25, 2017

(51) Int. Cl.
  *H03M 1/10* (2006.01)
  *H03M 1/06* (2006.01)
  *H03M 1/80* (2006.01)
  *H03M 1/68* (2006.01)
  *H03M 1/46* (2006.01)

(52) U.S. Cl.
  CPC ....... *H03M 1/1061* (2013.01); *H03M 1/0604* (2013.01); *H03M 1/468* (2013.01); *H03M 1/68* (2013.01); *H03M 1/802* (2013.01)

(58) Field of Classification Search
  CPC ...... H03M 1/466; H03M 1/002; H03M 1/804; H03M 1/1038; H03M 1/462; H03M 1/00; H03M 1/1019; H03M 1/1009; H03M 1/1033; H03M 1/1061; H03M 1/144; H03M 1/46; H03M 1/12; H03M 1/38; H03M 1/1057
  USPC ................................ 341/118, 120, 155, 172
  See application file for complete search history.

(56) References Cited

U.S. PATENT DOCUMENTS

| | | | |
|---|---|---|---|
| 8,884,801 B1 * | 11/2014 | Ranjbar ................ | H03M 1/145 341/156 |
| 9,100,034 B2 * | 8/2015 | Oshima ............... | H03M 1/1038 |
| 9,484,945 B1 * | 11/2016 | Wan ........................ | H03M 1/46 |
| 9,559,716 B1 * | 1/2017 | Matsui ................... | H03M 1/46 |
| 9,608,655 B1 * | 3/2017 | Li .......................... | H03M 1/069 |
| 9,800,255 B2 * | 10/2017 | Huang .................. | H03M 1/109 |
| 9,831,887 B2 * | 11/2017 | Wen ....................... | H03M 1/38 |
| 9,882,575 B1 * | 1/2018 | Li .......................... | H03M 1/1023 |
| 2012/0075128 A1 * | 3/2012 | Aruga ................. | H03M 1/1019 341/110 |
| 2013/0088375 A1 * | 4/2013 | Wu ..................... | H03M 1/1047 341/120 |

(Continued)

*Primary Examiner* — Linh Nguyen
(74) *Attorney, Agent, or Firm* — John R. Pessetto; Charles A. Brill; Frank D. Cimino

(57) ABSTRACT

An analog-to-digital converter includes a comparator, a capacitive digital-to-analog converter (DAC), and calibration circuitry. The capacitive DAC is coupled to the comparator, and includes a plurality of capacitors. The calibration circuitry is configured to adjust a value of each of the capacitors, and includes binary search circuitry and error correction circuitry. The binary search circuitry applies a binary search over a first number of bits of a multi-bit adjustment value used to adjust the value of one of the capacitors, and averages a first number of comparator output samples to determine each of the first number of bits. The error correction circuitry applies an error correction to the multi-bit adjustment value generated by the binary search, and averages a second number of comparator output samples for the error correction. The second number of comparator output samples is greater than the first number of comparator output samples.

14 Claims, 3 Drawing Sheets

(56) References Cited

U.S. PATENT DOCUMENTS

| | | | |
|---|---|---|---|
| 2013/0194115 A1* | 8/2013 | Wu | H03M 1/144 |
| | | | 341/110 |
| 2014/0247177 A1* | 9/2014 | Draxelmayr | H03M 1/0692 |
| | | | 341/156 |
| 2014/0253351 A1* | 9/2014 | Kumar | H03M 1/0617 |
| | | | 341/118 |
| 2015/0263756 A1* | 9/2015 | Chiu | H03M 1/468 |
| | | | 341/118 |
| 2016/0248435 A1* | 8/2016 | Harpe | H03M 1/1033 |

* cited by examiner

CAPACITOR CALIBRATION

BACKGROUND

An analog-to-digital converter (ADC) is an electronic circuit that converts an analog signal into a digital value that represents the analog signal. One well-known type of ADC is a successive approximation register (SAR) ADC. A SAR ADC includes a digital-to-analog converter (DAC), which may be implemented with a series of capacitors and a number of switches. The capacitors have top plates that are connected together, and bottom plates that are individually connectable by way of the switches to an input voltage, a reference voltage, and ground.

The capacitors include a number of binary-valued capacitors, such as 1C, 2C, 4C, 8C, and 16C, where 1C represents the capacitance and plate area of the smallest capacitor that can be fabricated with a given process. A 16C capacitor has 16× the capacitance and plate area of the 1C capacitor, while an 8C capacitor has 8× the capacitance and plate area of the 1C capacitor.

The binary-valued capacitors include a 1C dummy capacitor that allows the capacitor values to be evenly divided. For example, the first four binary-valued capacitors (1C, 2C, 4C, 8C) in combination with the 1C dummy capacitor have a total capacitance of 16C, which is equal to the fifth binary-valued capacitor (16C). Similarly, the first three binary-valued capacitors (1C, 2C, 4C) in combination with the 1C dummy capacitor have a total capacitance of 8C, which is equal to the fourth binary-valued capacitor (8C).

Each of the binary-valued capacitors, with the exception of the dummy capacitor, corresponds to a bit in the digital word output by the SAR ADC. For example, a SAR ADC that outputs a five-bit word typically has six binary-valued capacitors, five bit capacitors and one dummy capacitor.

The largest binary-valued capacitor (16C in the present example) represents the most significant bit (MSB), while the smallest binary-valued capacitor (1C in the present example) represents the least significant bit (LSB). In addition to the capacitive-based DAC, a SAR ADC also includes a comparator and a controller.

In operation, the capacitive-based DAC receives a sequence of control words from a DAC controller, which controls the positions of the switches which, in turn, determine whether the input voltage, the reference voltage, or ground is connected to the binary-weighted capacitors.

The sequence of connecting and reconnecting the voltages generates a sequence of DAC voltages at the input of the comparator, which compares the sequence of DAC voltages to ground, and outputs a sequence of logic values that represents the results of the comparisons. The controller interprets the sequence of logic values, and sequentially assigns a logic state to each bit position in the digital word that represents the input voltage.

A high-resolution SAR ADC can be formed by increasing the number of bits within the digital word that represents the input voltage. For example, a SAR ADC that outputs a 10-bit word has a much higher resolution than a SAR ADC that outputs a 5-bit word. However, as the number of bits increase, the size of the largest binary-valued capacitor significantly increases. The largest capacitor in a 5-bit word is 16× larger than the smallest capacitor, whereas the largest capacitor in a 10-bit word is 512× larger.

SUMMARY

An analog-to-digital converter (ADC) that applies binary and linear search to efficiently calibrate for mismatch in the capacitors of a capacitive digital-to-analog converter (DAC) is disclosed herein. In one embodiment, an ADC includes a comparator, a capacitive DAC, and calibration circuitry. The capacitive DAC is coupled to the comparator. The capacitive DAC includes a plurality of capacitors. The calibration circuitry is configured to adjust a value of each of the capacitors. The calibration circuitry includes binary search circuitry and error correction circuitry. The binary search circuitry is configured to apply a binary search over a first number of bits of a multi-bit adjustment value used to adjust the value of one of the capacitors, and to average a first number of comparator output samples to determine each of the first number of bits. The error correction circuitry is configured to apply an error correction to the multi-bit adjustment value generated by the binary search, and to average a second number of comparator output samples for the error correction. The second number of comparator output samples is greater than the first number of comparator output samples.

In another embodiment, a capacitive DAC includes a plurality of capacitors and calibration circuitry. The calibration circuitry is configured to adjust a value of each of the capacitors. The calibration circuitry includes binary search circuitry and error correction circuitry. The binary search circuitry is configured to apply a binary search over a first number of bits of a multi-bit adjustment value used to adjust the value of one of the capacitors, and to apply a first number of averaging cycles to an input signal to determine each of the first number of bits. The error correction circuitry is configured to apply an error correction to the multi-bit adjustment value generated by the binary search, and to apply a second number of averaging cycles to the input signal to determine the error correction. The second number of averaging cycles is greater than the first number of averaging cycles.

In a further embodiment, a method for adjusting capacitance in an ADC includes: on power up of the ADC, for each capacitor of a plurality capacitors of a capacitive digital-to-analog converter applying a binary search over a first number of bits of a multi-bit adjustment value to be used to adjust the value of the capacitor. The method also includes applying a first number of averaging cycles to a comparator output for each of the first number of bits. The method further includes applying an error correction to the multi-bit adjustment value generated by the binary search. The method yet further includes applying a second number of averaging cycles to comparator output for the error correction. The second number of averaging cycles is greater than the first number of averaging cycles.

BRIEF DESCRIPTION OF THE DRAWINGS

For a detailed description of various examples, reference will now be made to the accompanying drawings in which.

DETAILED DESCRIPTION

Figure 1:
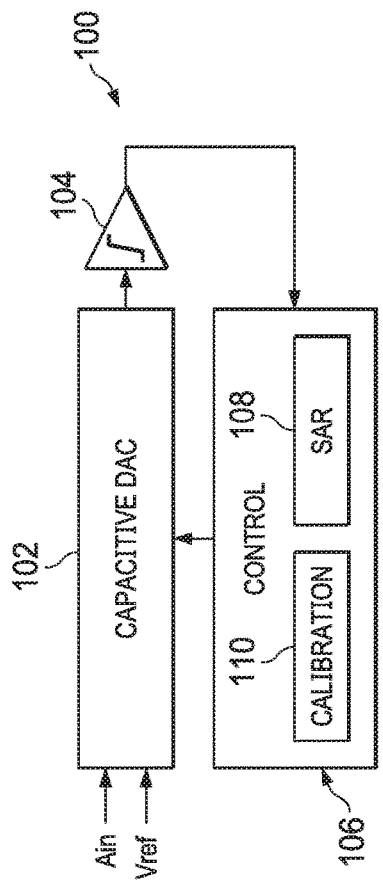
FIG. 1 shows a block diagram for a successive approximation register (SAR) analog-to-digital converter (ADC) that includes capacitor calibration in accordance with various embodiments.

Certain terms are used throughout the following description and claims to refer to particular system components. As one skilled in the art will appreciate, different parties may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ."Also, the term "couple" or "couples" is intended to mean either an indirect or direct wired or wireless connection. Thus, if a first device couples to a second device, that connection may be through a direct connection or through an indirect connection via other devices and connections.

In successive approximation register (SAR) analog-to-digital converters (ADCs), mismatches in the values of the capacitors of a capacitive digital-to-analog converter (DAC) can lead performance degradation. For example, capacitor mismatch may increase integral nonlinearity or differential nonlinearity. To reduce capacitor mismatch, SAR ADCs may perform a calibration at power up. In high precision ADCs, the capacitor mismatch should be corrected to less than one least significant bit (LSB). The presence of noise in the ADC dictates that a large number of samples be averaged to estimate capacitor mismatch to a sub-LSB level. Averaging a large number of samples can substantially increase calibration time.

In determining a value for correcting a capacitor in a capacitive DAC, the averaging is selected so that the noise standard deviation (3σ) is equal to an LSB. Assuming $\sigma_n$ as the total noise standard deviation at the top plate of the capacitor being calibrated, and $\Delta$ as the voltage change on the top plate due to an LSB change in correction value, the number of samples to be averaged for each correction value during search for a calibration value is $$\left(\frac{\sigma_n}{\Delta}\right)^2.$$

For a linear search, the total number of cycles required per capacitor is $$2^{b-1}\left(\frac{\sigma_n}{\Delta}\right)^2,$$

where b is the correction resolution. For a binary search, the total number of cycles required per capacitor is $$b\left(\frac{\sigma_n}{\Delta}\right)^2.$$

Embodiments of the present disclosure reduce the time needed to calibrate a capacitor by reducing the number of averaging cycles applied to determine at least some of the bits of a multi-bit capacitance adjustment value. Embodiments determine the value of a predetermined number of most significant bits (MSBs) of the capacitance adjustment value using a binary search and reduced number of averaging cycles. After the predetermined number of MSBs have been determined, embodiments execute an error correction operation to correct for errors in the generation of the MSBs. Some embodiments determine the value of remaining least significant bits of the adjustment value using a binary search with a higher number of averaging cycles. Determining the MSBs with a reduced number of averaging cycles can significantly reduce the total number of cycles applied to determine the adjustment value. For example, embodiments may determine a 10-bit adjustment value in about ⅓ of the time required to determine the adjustment value in a conventional system.

In some embodiments disclosed herein, after the predetermined number of MSBs have been determined using a binary search and reduced averaging cycles, a linear search using a higher number of averaging cycles is executed to provide correction of one or more LSBs of error introduced by the reduced averaging of the binary searches. As in embodiments applying all binary searching, determining the MSBs with a reduced number of averaging cycles can significantly reduce the total number of cycles applied to determine the adjustment value. For example, even with error correction using linear searching and increased averaging, embodiments may determine a 10-bit adjustment value in less than ⅓ of the time required to determine the adjustment value in a conventional system.

FIG. 1 shows a block diagram for a SAR ADC 100 that includes capacitor calibration in accordance with various embodiments. The SAR ADC 100 includes a capacitive DAC 102, a comparator 104, and control circuitry 106. Analog signal (Ain) to be digitized and one or more reference voltages (Vref) are received by the capacitive DAC 102. The capacitive DAC 102 is coupled to the comparator 104, and the output of the capacitive DAC 102 is provided as an input to the comparator 104. The comparator 104 compares the output of the capacitive DAC 102 to a reference voltage (e.g., ground). In some embodiments, the capacitive DAC 102 outputs a differential signal to the comparator 104 and the comparator 104 compares the two signals that make up the differential signal. The output of the comparator 104 indicates whether the output of the capacitive DAC 102 exceeds a threshold. For example, the threshold may represent voltage corresponding to a particular bit of the digital value produced by the SAR ADC 100.

The control circuitry 106 receives the output of the comparator 104. The control circuitry 106 includes a successive approximation circuitry 108 and calibration circuitry 110. The successive approximation circuitry 108 includes a successive approximation register for storage of the bits generated during digitization of Ain, and logic (e.g., state machine logic) to control the operation of the capacitive DAC 102 during digitization of Ain.

The calibration circuitry 110 includes circuitry to control the calibration of the capacitors of the capacitive DAC 102. For example, the calibration circuitry 110 may include a processor, a state machine, or other controller to manipulate circuitry of the capacitive DAC 102 such that differences in the values of the capacitors of the capacitive DAC 102 are minimized. The calibration circuitry 110 reduces the time required to calibrate the capacitors of the capacitive DAC 102 by reducing the number of averaging cycles applied to determine bits of an adjustment value applied to calibrate a capacitor. A predetermined number of MSBs of the adjustment value may be determined with averaging of a reduced number of samples. After selecting values for the MSBs using reduced averaging, the calibration circuitry 110 may apply an error correction cycle that includes a higher number of averaging cycles. For example, the calibration circuitry 110 may apply $$\left(\frac{\sigma_n}{\Delta}\right)^2$$

averaging cycles in an error correction, and apply only a fraction (e.g., ¼th) of $$\left(\frac{\sigma_n}{\Delta}\right)^2$$

averaging cycles to the bits of the adjustment value selected prior to the error correction.

Some embodiments of the calibration circuitry 110 apply a binary search to determine each bit of the adjustment value. Some embodiments, apply a binary search determine the values of more significant bits and apply a linear search to provide correction of one or more LSBs of error accumulated during the binary search. For example, for an 8-bit adjustment value, the values of 8 bits may be determined using a binary search and reduced averaging, and 2 LSBs of error may be corrected using linear search and averaging of $$\left(\frac{\sigma_n}{\Delta}\right)^2$$

samples. By reducing the number of averaging cycles applied to determine the adjustment needed to calibrate a capacitor, the calibration circuitry 110 reduces the total time needed to calibrate the capacitive DAC 102.

Figure 2:
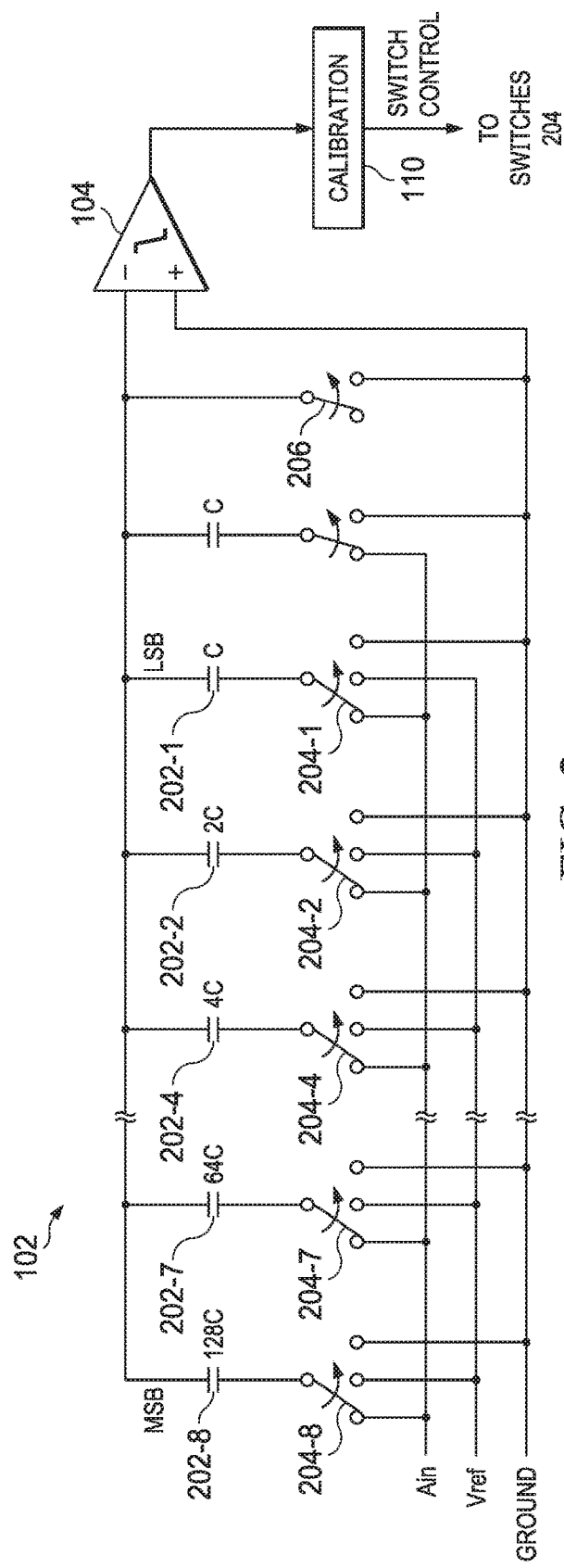
FIG. 2 shows a schematic diagram of a capacitive digital-to-analog converter (DAC) suitable for capacitor calibration in accordance with various embodiments.

FIG. 2 shows a schematic diagram of a capacitive DAC 102 suitable for capacitor calibration in accordance with various embodiments. The capacitive DAC 102 includes a plurality of capacitors 202, where one capacitor 202 corresponds to each bit of the DAC 102. While, the capacitive DAC 102 is illustrated as an 8-bit DAC, various embodiments of the capacitive DAC 102 may include a different number of bits and a corresponding number of capacitors 202.

In the capacitive DAC 102, the capacitor 202-1 has capacitance C and corresponds the least significant bit of the DAC. Each successive capacitor 202 of the capacitive DAC 102 has double the capacitance of the capacitor corresponding to the next lower bit. Accordingly, capacitor 202-2 has capacitance 2C, capacitor 202-4 has capacitance 4C, capacitor 202-7 has capacitance 64C, and capacitor 202-8 has capacitance 128C. The capacitors 202 are coupled to switches 204 that switchably connect the lower plates of the capacitors 202 to Ain, Vref, ground, or another voltage. The switch 206 switchably connects the top plate of the capacitors 202 to ground.

The calibration circuitry 110 controls the switches 204 corresponding to the capacitors 202 during the calibration process, and evaluates the output of the comparator 104 to determine how the value of the capacitor 202 should be adjusted.

Figure 3:
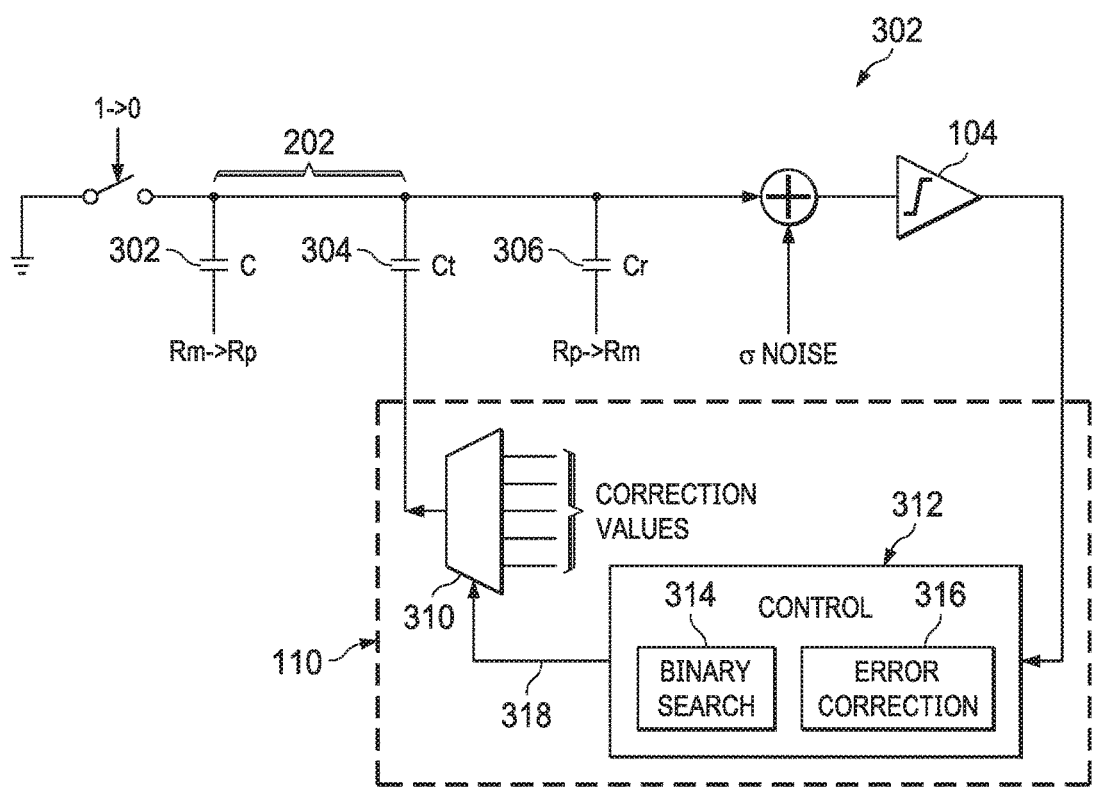
FIG. 3 shows capacitors in a capacitive DAC used for capacitor calibration in accordance with various embodiments.

FIG. 3 shows capacitors in a capacitive DAC 302 used for capacitor calibration in accordance with various embodiments. The capacitive DAC 302 is an embodiment of the capacitive DAC 102. In the capacitive DAC 302, capacitors corresponding to only a single bit are shown to promote clarity. The capacitor 302 corresponds to one of the capacitors 202 shown in FIG. 2. A trim capacitor 304 is associated the capacitor 302. Thus, the capacitor 302 and the trim capacitor 304 combine to form one of the capacitors 202 shown in FIG. 2.

The calibration circuitry 110 includes binary search circuitry 314, error correction circuitry 316, and correction voltage selector 310. The calibration circuitry 110 controls, via the adjustment value 318, the correction voltage applied to the trim capacitor 304 via the selector 310 to adjust the capacitance of the capacitor 202 formed by the combination of the capacitor 302 and the trim capacitor 304. The presence of noise in the voltage provided by the capacitors 202, 306 to the comparator 104 dictates that the control circuitry 312 average samples of the output of the comparator 104 to determine what changes should be made to the adjustment value 318 that controls the output of the selector 310. For example, if a last change to the adjustment value 318 caused the averaged output of the comparator 104 to indicate a state change, then the control circuitry 312 may return the adjustment value to a value 318 last presented (e.g., reset a last set bit for a binary search or decrement the adjustment value for a linear search).

The control circuitry 312 may implement a binary search and/or a linear search for the adjustment value to be applied to the selector 310 that best calibrates the capacitor 202 with respect to the reference capacitor 306. The binary search circuitry 314 may control the operations of the binary search. The error control circuitry 316 may provide error control operations including linear search operations. The control circuitry 312 may also vary the number of comparator output samples averaged to produce a decision with regard to a current adjustment value.

Some embodiments of the control circuitry 312 apply a binary search (via the binary search circuitry 314) to determine each bit of the adjustment value. A binary search using reduced averaging is applied by the binary search circuitry 314 to select the values of a predetermined number of MSBs of the adjustment value. After the values of the MSBs have been selected, the error correction circuitry 316 may execute an error correction operation that includes a higher number of averaging cycles. That is, the number of averaging cycles applied by during error correction may be higher than the number of averaging cycles applied during the binary searches executed prior to the error correction. The error correction cycle may correct up to $2^{b-n-1}$ LSBs of the adjustment value, where b is the total number of bits in the adjustment value and n is the predetermined number of MSBs of the adjustment value selected by binary searches preceding the error correction cycle.

The error correction operation provides an additional decision by the comparator 104 based on which $2^{b-n-1}$ codes are added to or subtracted from the current adjustment value. For example, for a 5-bit adjustment value (0 to 31 codes), where correction should ideally converge to a value of 18, normal binary search proceeds as follows:

16→24→20→18→17→18.

If an error is made in the selection of the MSB of the adjustment value, then binary search proceeds as:

16→8→12→14→15→16.

If a correction operation is applied after selection of the 3rd bit, then the search proceeds as:

16→8→12→14→16→17→18

Following the error correction operation, any remaining LSBs may be selected using a binary search and a higher number of averaging cycles. For example, for a 6-bit adjustment value, Table 1 shows the number of averaging cycles applied by the control circuitry 312, where $$N = \left(\frac{\sigma_n}{\Delta}\right)^2.$$

While the positioning of the error correction cycle after 4 MSBs is non-optimal, the example shows that even a non-optimal implementation of the calibration circuitry 110 substantially reduces capacitor calibration time.

TABLE 1

| Bit-> | 5 | 4 | 3 | 2 | EC | 1 | 0 | Total |
|---|---|---|---|---|---|---|---|---|
| Conventional | N | N | N | N | 0 | N | N | 6N |
| Calibration Circuitry 110 | .11N | .11N | .11N | .11N | N | N | N | 3.44N |

Table 2 shows the optimal location of the error correction operation and the number of averaging cycles applied by the control circuitry 312 for a number of different sizes (number of bits) of the adjustment value.

TABLE 2

| Resolution(Bits) | 3 | 4 | 5 | 6 | 7 | 8 | 9 | 10 |
|---|---|---|---|---|---|---|---|---|
| EC bit position | 3 | 4 | 5 | 6 | 7 | 8 | 9 | 10 |
| Number of cycles | 1.75N | 2N | 2.25N | 2.5N | 2.75N | 3N | 3.25N | 3.5N |
| Number of cycles (conventional) | 3N | 4N | 5N | 6N | 7N | 8N | 9N | 10N |

Some embodiments of the control circuitry 312, apply a binary search with reduced averaging to determine the values of more significant bits and apply a linear search with increased averaging to correct one or more LSBs of error introduced by the binary search. If k+1 LSBs of error are allowed during the binary search, then k bits of error are to be corrected using the linear search. In the control circuitry 312, the optimal value of k is selected as $$\sqrt[3]{2b} - 1,$$

where b is number of bits in the adjustment value.

Table 3 shows the number of LSBs to which linear search is applied as error correction and the total number of averaging cycles applied by the control circuitry 312 for a number of different sizes of the adjustment value.

TABLE 3

| Resolution(Bits) | 3 | 4 | 5 | 6 | 7 | 8 | 9 | 10 |
|---|---|---|---|---|---|---|---|---|
| Linear EC (in LSBs) | 1 | 1 | 1 | 1 | 1 | 2 | 2 | 2 |
| Number of cycles | 1.75N | 2N | 2.25N | 2.5N | 2.75N | 2.88N | 3N | 3.11N |
| Number of cycles (conventional) | 3N | 4N | 5N | 6N | 7N | 8N | 9N | 10N |

By reducing the number of averaging cycles applied to determine the adjustment needed to calibrate the capacitor 202, the control circuitry 312 reduces the total time needed to calibrate the capacitive DAC 102, and in turn reduces the power up initialization time of the ADC 100.

Figure 4:
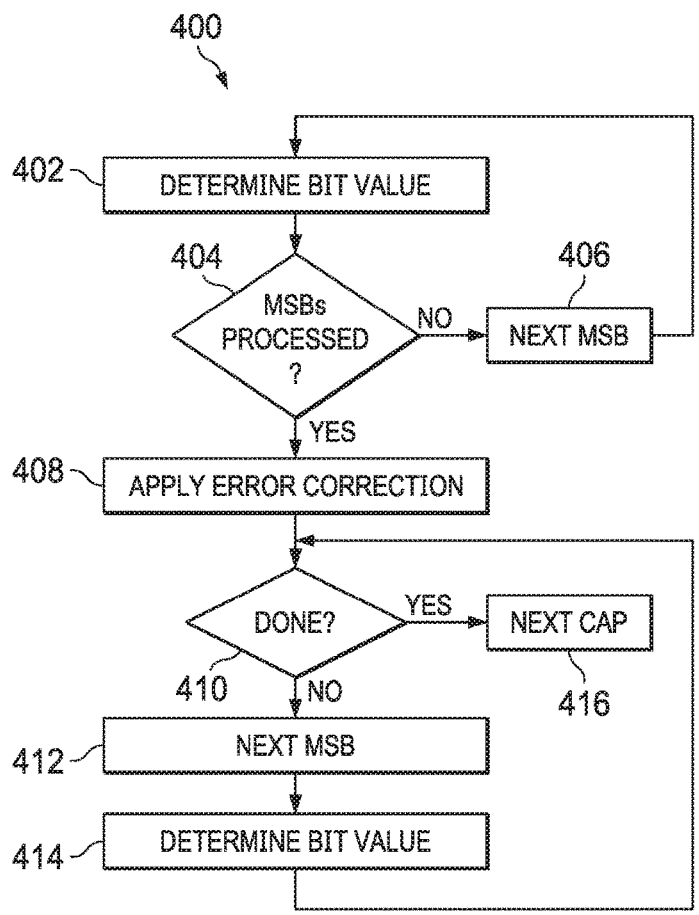
FIG. 4 shows a flow diagram for a first method for calibrating capacitors in a capacitive DAC in accordance with various embodiments.

FIG. 4 shows a flow diagram for a method 400 for calibrating capacitors 202 in a capacitive DAC 102 in accordance with various embodiments. Though depicted sequentially as a matter of convenience, at least some of the actions shown can be performed in a different order and/or performed in parallel. Additionally, some embodiments may perform only some of the actions shown. The operations of the method 400 may be performed by the calibration circuitry 110 with respect to the capacitors 202.

In block 402, the calibration circuitry 110 is adjusting the value of a capacitor 202 by determining a value of voltage on the trim capacitor 304 that results in the capacitance of the capacitor 202 most closely matching the capacitance of the reference capacitor 306. The value of voltage is represented by a multi-bit adjustment value that selects the value of voltage applied to the trim capacitor 304. In block 402, the calibration circuitry 110 applies a binary search to determine the value of a bit of the adjustment value. To reduce the influence of noise on the bit selection decision, the calibration circuitry 110 may average a number of samples of the output of the comparator 104. To reduce calibration time, the calibration circuitry 110 averages fewer than $$\left(\frac{\sigma_n}{\Delta}\right)^2$$

samples (e.g., $$0.11\left(\frac{\sigma_n}{\Delta}\right)^2$$

samples) of the comparator output in block 402.

In block 404, the calibration circuitry 110 determines whether the values of a predetermined number of MSBs of the adjustment value have been selected. For example, referring to Table 2, with an 8-bit adjustment value, the values of 6 MSBs may be selected prior to execution of the error correction. If the values of the predetermined number of MSBs of the adjustment value have not been selected, then the next MSB to be tested is selected in block 406, and the value of the MSB is determined in block 402.

If, in block 404, the values of the predetermined number of MSBs of the adjustment value have been selected, then, in block 408, an error correction operation is performed to correct any errors that were introduced in the MSBs selected in block 402 by the reduced averaging. The error correction operation may include applying an increased number (relative to the number of averaging cycles applied in block 402) of averaging cycles to the comparator output (e.g., averaging $$\left(\frac{\sigma_n}{\Delta}\right)^2$$

samples) in a binary search.

In block 410, the calibration circuitry 110 determines whether the values of all bits of the adjustment value have been selected. If the values of all bits of the adjustment value have not been selected, then the next MSB to be tested is selected in block 412, and the value of the MSB is determined in block 414.

In block 414, the calibration circuitry 110 applies a binary search to determine the value of a bit of the adjustment value. To improve calibration accuracy, the calibration circuitry 110 averages an increased number, e.g., $$\left(\frac{\sigma_n}{\Delta}\right)^2,$$

of comparator output samples relative to the averaging applied in block 402. For example, the number of averaging cycles applied in block 414 may the same as the number of averaging cycles applied in block 408.

If the values of all bits of the adjustment value have been selected, then the calibration circuitry 110 proceeds to calibrate a next capacitor 202 in block 416. The process continues until all capacitors 202 have been calibrated.

Figure 5:
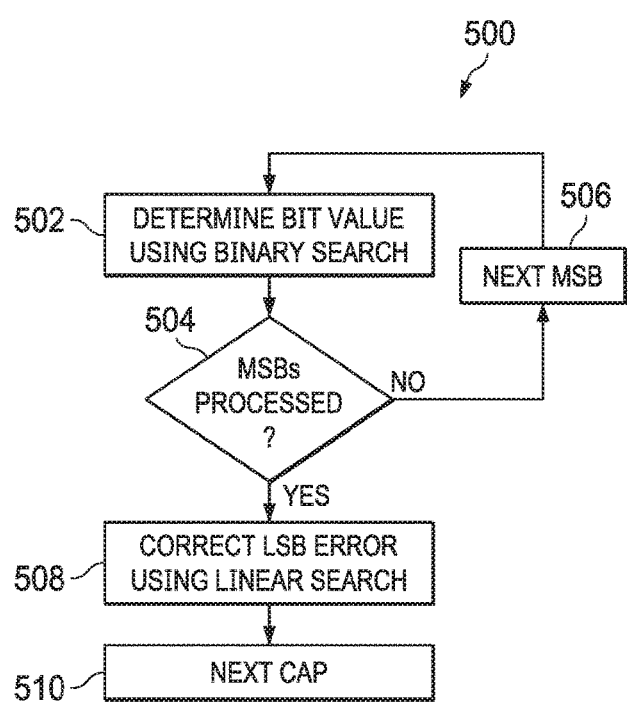
FIG. 5 shows a flow diagram for a second method for calibrating capacitors in a capacitive DAC in accordance with various embodiments.

FIG. 5 shows a flow diagram for a method 500 for calibrating capacitors 202 in a capacitive DAC 102 in accordance with various embodiments. Though depicted sequentially as a matter of convenience, at least some of the actions shown can be performed in a different order and/or performed in parallel. Additionally, some embodiments may perform only some of the actions shown. The capacitive DAC 102 may be a component of the SAR ADC 100. The operations of the method 500 may be performed by the calibration circuitry 110 with respect to the capacitors 202.

In block 502, the SAR ADC 100 is initializing at power-up. The calibration circuitry 110 is adjusting the value of a capacitor 202 by determining a value of voltage on the trim capacitor 304 that results in the capacitance of the capacitor 202 most closely matching the capacitance of the reference capacitor 306. The value of voltage is represented by a multi-bit adjustment value that selects the value of voltage applied to the trim capacitor 304. In block 502, the calibration circuitry 110 is applying a binary search and determining the value of a bit of the adjustment value. To reduce the influence of noise on the bit value selection decision, the calibration circuitry 110 may average a number of samples of the output of the comparator 104. To reduce calibration time, the calibration circuitry 110 averages fewer than $$\left(\frac{\sigma_n}{\Delta}\right)^2$$

samples (e.g., $$0.25\left(\frac{\sigma_n}{\Delta}\right)^2$$

samples) of the comparator output in block 502.

In block 504, the calibration circuitry 110 determines whether the values of all of the bits of the adjustment value have been selected. If the values of all of the bits of the adjustment value have not been selected, then the next MSB of the adjustment value to be tested is selected in block 506, and the value of the MSB is determined in block 502.

If, in block 504, the values of all of the bits of the adjustment value have been selected, then, in block 508, an error correction cycle is performed to correct any errors that were introduced in the bits of the adjustment value selected in block 502 by the reduced averaging. The error correction may include applying an increased number of averaging cycles to the comparator output (e.g., averaging $$\left(\frac{\sigma_n}{\Delta}\right)^2$$

samples) in a linear search.

In block 510, the values of all bits of the adjustment value have been selected, and the calibration circuitry 110 proceeds to calibration a next capacitor 202.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An analog-to-digital converter (ADC), comprising:
    a comparator;
    a capacitive digital-to-analog converter (DAC) coupled to the comparator, the capacitive DAC comprising a plurality of capacitors; and
    calibration circuitry configured to adjust a value of the capacitors, the calibration circuitry comprising:
        binary search circuitry configured to:
            apply a binary search over a first number of bits of a multi-bit adjustment value used to adjust the value of one of the capacitors; and
            average a first number of comparator output samples to determine each of the first number of bits; and
        error correction circuitry configured to:
            apply an error correction to the multi-bit adjustment value generated by the binary search; and
            average a second number of comparator output samples for the error correction;
            wherein the second number of comparator output samples is greater than the first number of comparator output samples.

2. The ADC of claim 1, wherein the binary search circuitry is configured to:
    apply, after application of the error correction, a binary search over a second number of bits of the multi-bit adjustment value; and
    average a third number of comparator output samples to determine each of the second number of bits;
    wherein the third number of comparator output samples is greater than the first number of comparator output samples.

3. The ADC of claim 2, wherein the third number of comparator output samples is equal to the second number of comparator output samples.

4. The ADC of claim 1, wherein the error correction corrects up to $2^{b-n-1}$ bits, where:

b is a total number of bits in the multi-bit adjustment value; and n is the first number of bits of the multi-bit adjustment value.

5. The ADC of claim 1, wherein the error correction circuitry is configured to execute a linear search as part of the error correction.

6. The ADC of claim 1, wherein the first number of bits is equal to a total number of bits in the multi-bit adjustment value.

7. The ADC of claim 1, wherein the error correction corrects up to $$\sqrt[3]{2b} - 1$$

bits, where b is a total number of bits in the multi-bit adjustment value.

8. A capacitive digital-to-analog converter (DAC), comprising:
   a plurality of capacitors; and
   calibration circuitry configured to adjust a value of each of the capacitors, the calibration circuitry comprising:
      binary search circuitry configured to:
         apply a binary search over a first number of bits of a multi-bit adjustment value used to adjust the value of one of the capacitors; and
         apply a first number of averaging cycles to an input signal to determine each of the first number of bits; and
      error correction circuitry configured to:
         apply an error correction to the multi-bit adjustment value generated by the binary search; and
         apply a second number of averaging cycles to the input signal to determine the error correction;
   wherein the second number of averaging cycles is greater than the first number of averaging cycles.

9. The capacitive DAC of claim 8, wherein the binary search circuitry is configured to:
   apply, after application of the error correction, a binary search over a second number of bits of the multi-bit adjustment value; and
   apply a third number of averaging cycles to the input signal for each of the second number of bits;
   wherein the third number of averaging cycles is greater than the first number of averaging cycles.

10. The capacitive DAC of claim 9, wherein the third number of averaging cycles is equal to the second number of averaging cycles.

11. The capacitive DAC of claim 8, wherein the error correction corrects up to $2^{b-n-1}$ bits, where:
   b is a total number of bits in the multi-bit adjustment value; and
   n is the first number of bits of the multi-bit adjustment value.

12. The capacitive DAC of claim 8, wherein the error correction circuitry is configured perform a linear search as part of the error correction.

13. The capacitive DAC of claim 8, wherein the first number of bits is equal to a total number of bits in the multi-bit adjustment value.

14. The capacitive DAC of claim 8, wherein the error correction corrects up to $$\sqrt[3]{2b} - 1$$

bits, where b is a total number of bits in the multi-bit adjustment value.

* * * * *